United States Patent [19]
Ishida et al.

[11] Patent Number: 5,561,299
[45] Date of Patent: Oct. 1, 1996

[54] X-Y STAGE AND CHARGED PARTICLE BEAM EXPOSURE APPARATUS

[75] Inventors: Kazushi Ishida; Kouji Takahata; Tooru Ikeda, all of Kawasaki, Japan

[73] Assignee: Fujitsu Limited, Kawasaki, Japan

[21] Appl. No.: 506,641

[22] Filed: Jul. 25, 1995

[30] Foreign Application Priority Data

Aug. 18, 1994 [JP] Japan .................................. 6-194441

[51] Int. Cl.$^6$ ................................................. H01J 37/20
[52] U.S. Cl. ....................................... 250/442.11; 33/1 M
[58] Field of Search ......................... 250/442.11, 440.11, 250/310, 492.2; 356/401, 358, 363; 33/1 M, 568

[56] References Cited

U.S. PATENT DOCUMENTS 4,372,223  2/1983  Iwatani ..................................... 33/1 M
5,214,290  5/1993  Sakai .................................. 250/442.11

Primary Examiner—Jack I. Berman
Assistant Examiner—Kiet T. Nguyen
Attorney, Agent, or Firm—Armstrong, Westerman, Hattori, McLeland & Naughton

[57] ABSTRACT

An X-Y stage includes a base having a first guide rail extending in a first direction, a stage having a second guide rail extending in a second direction perpendicular to the first direction, where the stage is movable with respect to the base in mutually perpendicular directions X and Y, and a slider arranged between the base and the stage and having a plurality of first wheels provided with respect to the first guide rail and rotatable under guidance of the first guide rail and a plurality of second wheels provided with respect to the second guide rail and rotatable under guidance of the second guide rail. The first wheels block a movement of the slider in the second direction by engaging the first guide rail when the stage moves in the second direction, and the second wheels block a movement of the slider in the first direction by engaging the second guide rail when the stage moves in the first direction. In addition, the slider is arranged in at least three locations.

21 Claims, 7 Drawing Sheets

X-Y STAGE AND CHARGED PARTICLE BEAM EXPOSURE APPARATUS

BACKGROUND OF THE INVENTION

The present invention generally relates to X-Y stages and charged particle beam exposure apparatuses, and more particularly to an X-Y stage which is used in machine tools, semiconductor device producing apparatuses and the like in which there are demands to make the X-Y stage compact and to move the X-Y stage at a high speed and a high precision, and to a charged particle beam exposure apparatus having such an X-Y stage.

The X-Y stage is used in machine tools, semiconductor device producing apparatuses and the like to move a member which is to be processed and is placed on the X-Y stage. Recently, there are increased demands to make the X-Y stage compact and to move the X-Y stage at a high speed and a high precision.

FIG. 1 is a perspective view showing an example of a conventional X-Y stage. The X-Y stage shown in FIG. 1 generally includes a base 100, an X-stage 101 and a Y-stage 102. A member (not shown) which is to be processed is placed on the Y-stage 102.

The base 100 has a groove 111, a pair of retainers 112 provided within the groove 111, and an upper surface 100a provided with a pair of retainers 113. Each of the retainers 112 and 113 are provided with a plurality of rotatable cylindrical rollers or balls 114. The retainers 112 and 113 are respectively movable in a direction X.

The X-stage 101 is provided on the base 100, and in this state, the retainers 112 guide a projection 115 of the X-stage 101, and the retainers 113 guide a bottom surface of the X-stage 101. In other words, the retainers 112 accurately guide the X-stage 101 in the direction X, and the retainers 113 support the weight of the X-stage 101. The X-stage 101 is fixed on one end of a rod 116, and is moved in the direction X by an actuator (not shown) that is provided on the other end of the rod 116. The retainers 112 and 113 respectively move in the direction X together with the movement of the X-stage 101.

A pair of retainers 118 are provided within a groove 117 of the X-stage 101, and a pair of retainers 119 are provided on an upper surface 101a of the X-stage 101. Each of the retainers 118 and 119 are provided with a plurality of rotatable cylindrical rollers or balls 114. The retainers 118 and 119 are respectively movable in a direction Y.

The Y-stage 102 is provided on the X-stage 101, and in this state, the retainers 118 guide a projection 120 of the Y-stage 102 and the retainers 119 guide a bottom surface of the Y-stage 102. In other words, the retainers 118 accurately guide the Y-stage 102 in the direction Y, and the retainers 119 support the weight of the Y-stage 102. The Y-stage 102 is connected to one end of a rod 122 via a slider mechanism 121 which enables movement of the Y-stage 102 in the direction X, and the Y-stage 102 is moved in the direction Y by an actuator (not shown) that is provided on the other end of the rod 122. The retainers 118 and 119 respectively move in the direction Y together with the movement of the Y-stage 102.

The Y-stage 102 of the X-Y stage having the above described construction thus moves in the X-Y directions depending on the moving directions and the moving quantities of the rods 116 and 122.

However, when an attempt was made to make the above X-Y stage compact and to realize a high speed movement and a high precision movement, the following problems occurred.

First, in order to move the X-Y stage with a high precision, it is essential that the large number of cylindrical rollers or balls 114 used are made with a high precision and are highly uniform. But there was a problem in that it is extremely difficult to manufacture the cylindrical rollers or balls 114 with the required precision and uniformity.

Second, since the X-stage 101 and the Y-stage 102 are respectively supported by the cylindrical rollers or balls 114, the X-stage 101 and the Y-stage 102 are supported at a large number of points. As a result, there was a problem in that it is difficult to accurately move the X-stage 101 and the Y-stage 102 on a plane without play, particularly because of the nonuniform dimensions of the cylindrical rollers or balls 114 introduced due to the manufacturing error. Of course, it is conceivable to make the cylindrical rollers or balls 114 from a material that has a slight resiliency so as to absorb the play between the X-stage 101 or the Y-stage 102 and its supporting plane. In this case, the cylindrical rollers or balls 114 would be resiliently deformed by the weight of the X-stage 101 or the Y-stage 102. However, when the X-stage 101 or the Y-stage 102 rides over the cylindrical columns or balls 114 which were not subjected to the weight of the X-stage 101 or the Y-stage 102 and were thus not resiliently deformed, the so-called pitching of the X-stage 101 or the Y-stage 102 would occur. This pitching is a phenomenon in which the leading end of the X-stage 101 or the Y-stage 102 moves slightly upwards as it rides over the non-deformed cylindrical rollers or balls 114 while the trailing end of the X-stage 101 or the Y-stage 102 moves slightly downwards. For this reason, if slightly resilient cylindrical rollers or balls 114 were used, a new problem would be introduced in that the movements of the X-stage and the Y-stage 102 will be discontinuous and unstable because the cylindrical rollers or balls 114 are provided at extremely small intervals (or pitch).

Third, because the X-Y stage uses a large number of parts and has a complicated construction, there were problems in that the X-Y stage as a whole is heavy and it is difficult to move the X-Y stage at a high speed. In other words, in order to move the X-stage 101, it was necessary to apply a driving force with respect to the weight of each of the X-stage 101 and the Y-stage 102.

Fourth, each of the retainers 112, 113, 118 and 119 move by utilizing the rolling frictions of the X-stage 101 and the Y-stage 102, and move in synchronism with the corresponding one of the X-stage 101 and the Y-stage 102. For this reason, retainer stoppers (not shown) are provided at ends of the X-Y stage so that the retainers 112, 113, 118 and 119 make contact with the corresponding retainer stoppers and are stopped by the corresponding retainer stoppers. However, when the retainer makes contact with the retainer stopper as the X-stage 101 and/or the Y-stage 102 moves, an error occurred in a counted value of a counter (not shown) which detects the position of the X-Y stage due to the shock that is introduced by the contact. When the error occurred in the counted value of the counter, it was impossible to continue the continuous movement of the X-Y stage, and the process had to be stopped once. In addition, in order to reduce the possibility of the retainer making contact with the retainer stopper, it was necessary to make the entire X-Y stage large, and in this case, it was impossible to realize a compact X-Y stage.

Fifth, the X-Y stage had a 3-level structure including the base 100, the X-stage 101 and the Y-stage 102 as shown in FIG.1. In other words, the X-stage 101 is provided on the base 100, and the Y-stage 102 is provided on the X-stage 101. For this reason, a guide mechanism and the like are provided under the Y-stage 102, and there was a problem in that it is impossible to carry out a process from under the Y-stage 102 with respect to the member which is to be processed and is placed on the Y-stage 102. In addition, it was also impossible to provide an opening at a central part of the base 100 to enable processing from under the Y-stage 102, because the guide mechanism and the like are provided at a part confronting the central part.

SUMMARY OF THE INVENTION

Accordingly, it is a general object of the present invention to provide a novel and useful X-Y stage and a charged particle beam exposure apparatus, in which the problems described above are eliminated.

Another and more specific object of the present invention is to provide an X-Y stage comprising a base having a first guide rail extending in a first direction, a stage having a second guide rail extending in a second direction perpendicular to the first direction, the stage being movable with respect to the base in mutually perpendicular directions X and Y, and a slider arranged between the base and the stage and having a plurality of first wheels provided with respect to the first guide rail and rotatable under guidance of the first guide rail and a plurality of second wheels provided with respect to the second guide rail and rotatable under guidance of the second guide rail, where the first wheels block a movement of the slider in the second direction by engaging the first guide rail when the stage moves in the second direction, the second wheels block a movement of the slider in the first direction by engaging the second guide rail when the stage moves in the first direction, and the slider is arranged in at least three locations. According to the X-Y stage of the present invention, it is unnecessary to use parts which are made with an extremely high precision such as the cylindrical rollers or balls used in the conventional X-Y stage, and a single stage is moved in both the directions X and Y using a simple construction. For this reason, it is possible to continuously move the stage at a high speed and with a high precision without play. In addition, the number of parts of the X-Y stage is small, thereby making it possible to reduce both the size and weight of the X-Y stage as a whole. Furthermore, it is possible to provide an opening in the base at a part corresponding to a central portion of the stage.

Still another object of the present invention is to provide a charged particle beam exposure apparatus adapted to irradiate a charged particle beam on a substrate via a diaphragm, comprising an X-Y stage having the substrate placed thereon, and an in-lens type immersion lens converging and imaging the charged particle beam obtained via the diaphragm within a magnetic field of the in-lens type immersion lens onto the substrate, where the X-Y stage comprises a base having a first guide rail extending in a first direction, a stage having a second guide rail extending in a second direction perpendicular to the first direction, the stage being movable with respect to the base in mutually perpendicular directions X and Y, and a slider arranged between the base and the stage and having a plurality of first wheels provided with respect to the first guide rail and rotatable under guidance of the first guide rail and a plurality of second wheels provided with respect to the second guide rail and rotatable under guidance of the second guide rail, the first wheels blocking a movement of the slider in the second direction by engaging the first guide rail when the stage moves in the second direction, the second wheels blocking a movement of the slider in the first direction by engaging the second guide rail when the stage moves in the first direction, and the slider being arranged in at least three locations. According to the charged particle beam exposure apparatus of the present invention, it is possible to improve the resolution because the aberration (image blur) can be reduced. In addition, when obtaining the same resolution as that of the conventional charged particle beam exposure apparatus, it is possible to increase the diameter of the diaphragm, and the irradiation time of the charged particle beam can be shortened by an amount corresponding to the increased diameter of the diaphragm, thereby making it possible to considerably improve the throughput.

Other objects and further features of the present invention will be apparent from the following detailed description when read in conjunction with the accompanying drawings.

DESCRIPTION OF THE PREFERRED EMBODIMENTS

Figure 2A:
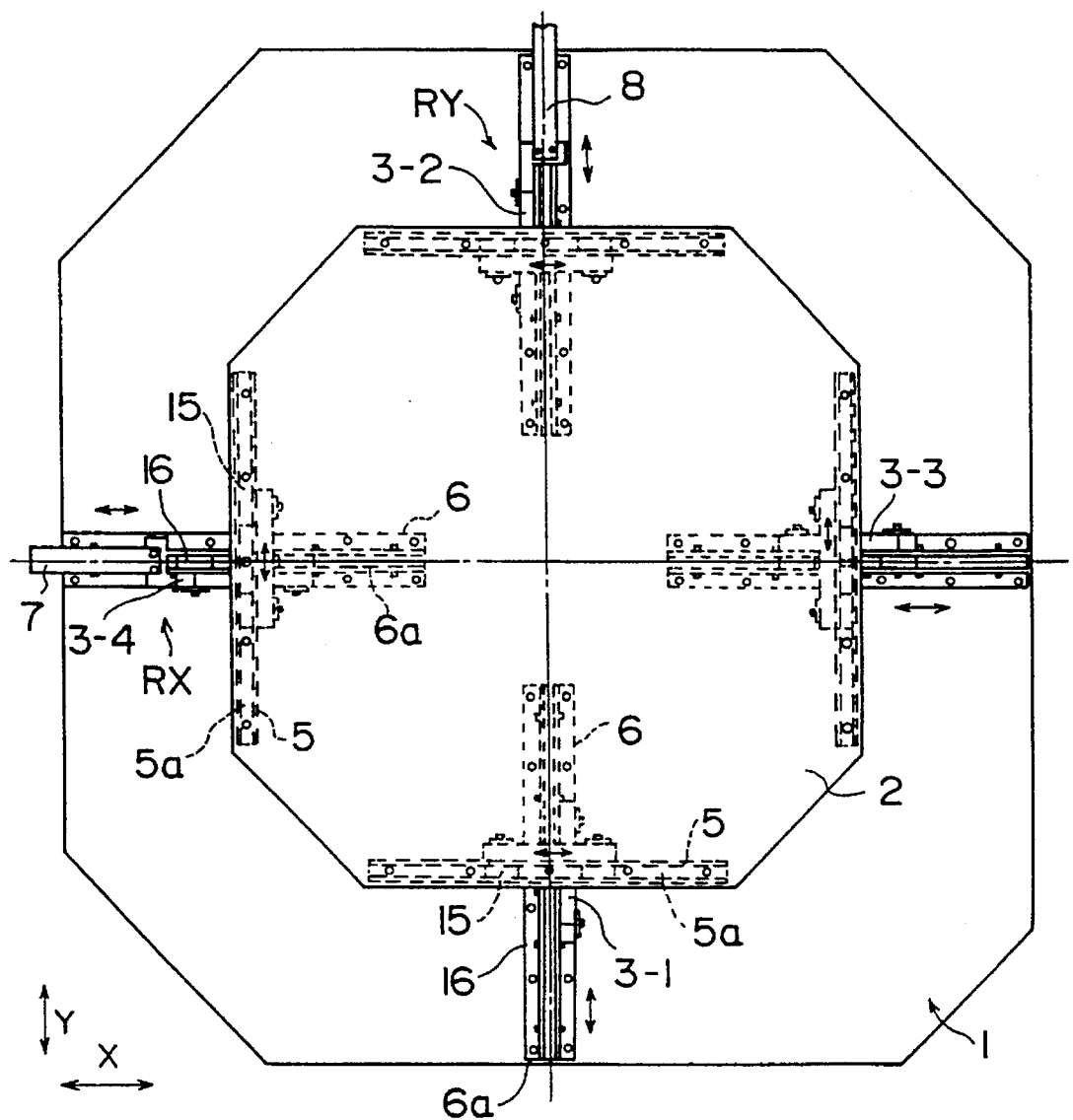
FIGS. 2A and 2B respectively are a plan view and a front view showing a first embodiment of an X-Y stage according to the present invention.

First, a description will be given of a first embodiment of an X-Y stage according to the present invention, by referring to FIGS. 2A and 2B. FIG. 2A shows a plan view of the first embodiment, and FIG. 2B shows a front view of the first embodiment.

Figure 2B:
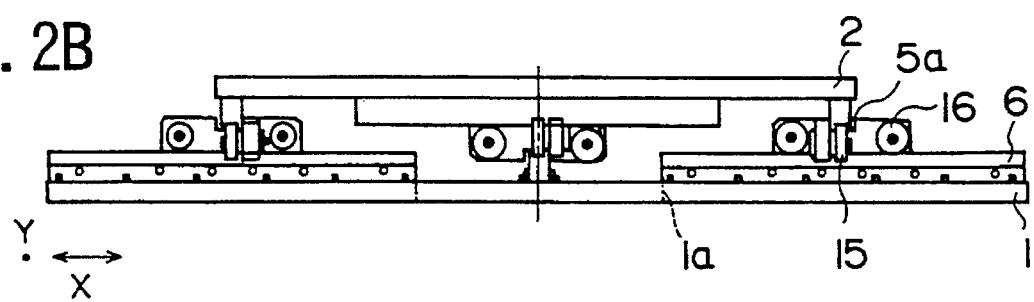

As shown in FIGS. 2A and 2B, an X-Y stage generally includes a lower plate (or base) 1, an upper plate (or stage) 2, and sliders 3-1 through 3-4. In this embodiment, the four sliders 3-1 through 3-4 are provided, and the upper plate 2 is movable in mutually perpendicular directions X and Y with respect to the lower plate 1 via these sliders 3-1 through 3-4. Out of the four sliders 3-1 through 3-4, the two sliders 3-3 and 3-4 are arranged at confronting positions on the right and left ends along the direction X, while the remaining two sliders 3-2 and 3-1 are arranged at confronting positions on the top and bottom ends along the direction Y.

Figure 3A:
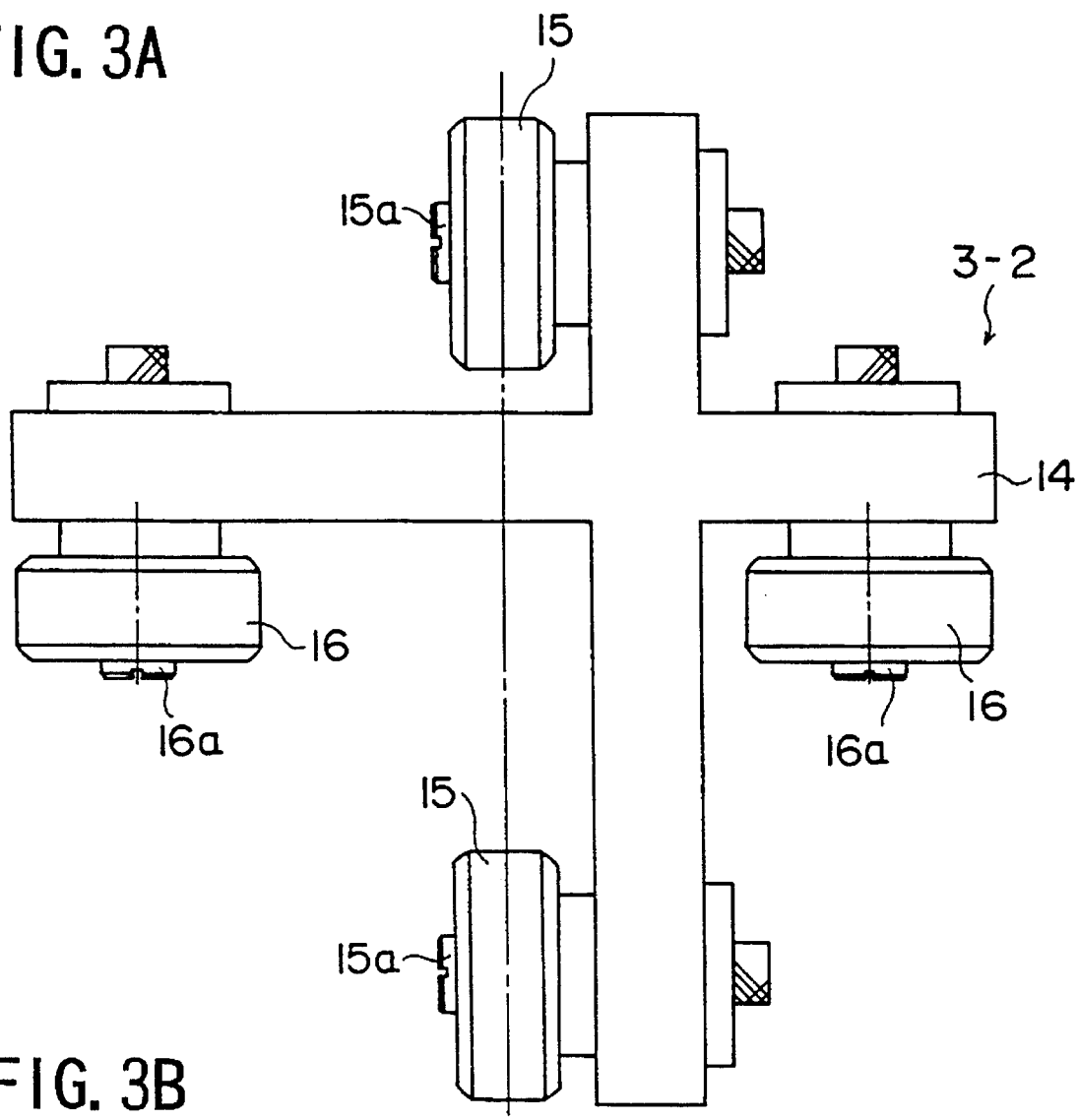
FIGS. 3A and 3B respectively are a plan view and a front view showing an embodiment of a slider.
Figure 3B:
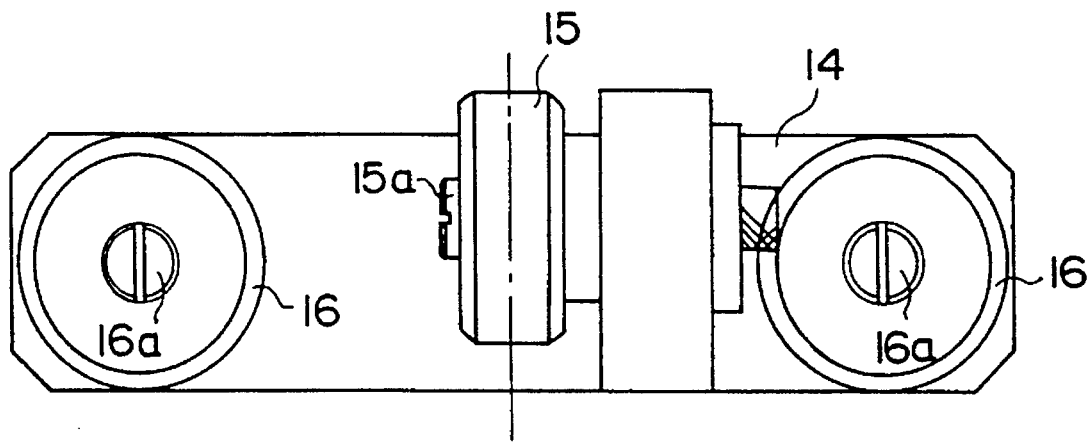

Each of the sliders 3-1 through 3-4 have a construction shown in FIGS. 3A and 3B. For the sake of convenience, the construction of the slider 3-3 will be described with reference to FIGS. 3A and 3B. FIG. 3A shows a plan view of the slider 3-3, and FIG. 3B shows a front view of the slider 3-3.

The slider 3-3 shown in FIGS. 3A and 3B generally includes a cross-shaped support member 14, and wheels 15 and 16 which are respectively provided on portions of the support member 14 extending in mutually perpendicular directions. Each wheel 15 is rotatably mounted on the support member 14 by a screw 15a via a bearing which is not visible in FIGS. 3A and 3B. Similarly, each wheel 16 is rotatably mounted on the support member 14 by a screw 16a via a bearing which is not visible in FIGS. 3A and 3B. In this embodiment, a total of four wheels, that is, two wheels 15 and two wheels 16, are provided on the support member 14. However, the number of wheels is of course not limited to four.

Each wheel 16 of the sliders 3-3 and 3-4 is rotatable along a groove 6a of a corresponding guide rail 6 on the lower plate 1 shown in FIGS. 2A and 2B, thereby making the sliders 3-3 and 3-4 movable in the direction X. On the other hand, each wheel 15 of the sliders 3-3 and 3-4 are rotatable along a groove 5a of a corresponding guide rail 5 on the lower plate 1, thereby making the sliders 3-3 and 3-4 movable in the direction Y.

Because each wheel 15 of the sliders 3-3 and 3-4 rotates within the groove 5a of the corresponding guide rail 5 under guidance of the groove 5a, the sliders 3-3 and 3-4, that is, the upper plate 2, will not vibrate or deviate in the direction X. On the other hand, each wheel 16 of the sliders 3-3 and 3-4 rotates within the groove 6a of the corresponding guide rail 6 under guidance of the groove 6a, and the sliders 3-3 and 3-4, that is, the upper plate 2, will not vibrate or deviate in the direction Y. In other words, when the upper plate 2 moves in the direction X, each wheel 15 of the sliders 3-3 and 3-4 engages the groove 5a of the corresponding guide rail 5 and is locked with respect to the direction X, and the sliders 3-3 and 3-4 and the upper plate 2 move in one piece in a state where each wheel 16 of the sliders 3-3 and 3-4 is guided along the groove 6a of the corresponding guide rail 6. In addition, when the upper plate 2 moves in the direction Y, each wheel 16 of the sliders 3-3 and 3-4 engages the groove 6a of the corresponding guide rail 6 and is locked with respect to the direction Y, and the sliders 3-3 and 3-4 and the upper plate 2 move in one piece in a state where each wheel 15 of the sliders 3-3 and 3-4 is guided along the groove 5a of the corresponding guide rail 5.

Similarly, each wheel 16 of the sliders 3-1 and 3-2 is rotatable along the groove 5a of the corresponding guide rail 5 on the lower plate 1 shown in FIGS. 2A and 2B, thereby making the sliders 3-1 and 3-2 movable in the direction Y. On the other hand, each wheel 15 of the sliders 3-1 and 3-2 is rotatable along the groove 6a of the corresponding guide rail 6 on the lower plate 1, thereby making the sliders 3-1 and 3-2 movable in the direction X.

Since each wheel 15 of the sliders 3-1 and 3-2 rotates within the groove 6a of the corresponding guide rail 6 under guidance of the groove 6a, the sliders 3-1 and 3-2, that is, the upper plate 2, will not vibrate or deviate in the direction Y. On the other hand, each wheel 16 of the sliders 3-1 and 3-2 rotates within the groove 5a of the corresponding guide rail 5 under guidance of the groove 5a, and the sliders 3-1 and 3-2, that is, the upper plate 2, will not vibrate or deviate in the direction X. In other words, when the upper plate 2 moves in the direction Y, each wheel 15 of the sliders 3-1 and 3-2 engages the groove 6a of the corresponding guide rail 6 and is locked with respect to the direction X, and the sliders 3-1 and 3-2 and the upper plate 2 move in one piece in a state where each wheel 16 of the sliders 3-1 and 3-2 is guided along the groove 5a of the corresponding guide rail 5. In addition, when the upper plate 2 moves in the direction X, each wheel 16 of the sliders 3-1 and 3-2 engages the groove 5a of the corresponding guide rail 5 and is locked with respect to the direction Y, and the sliders 3-1 and 3-2 and the upper plate 2 move in one piece in a state where each wheel 15 of the sliders 3-1 and 3-2 is guided along the groove 6a of the corresponding guide rail 6.

Figure 1:
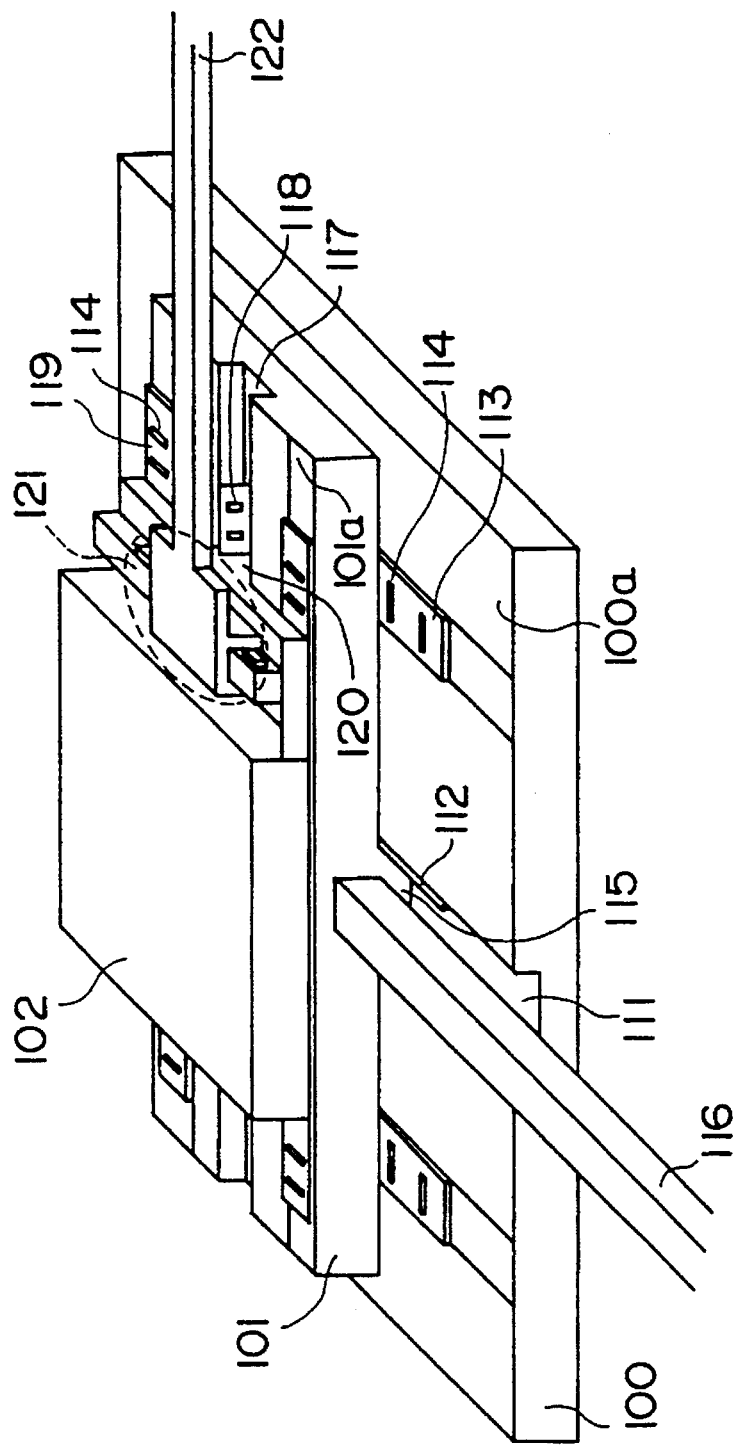
FIG. 1 is a perspective view showing an example of a conventional X-Y stage.

The intervals (or pitch) of the wheels 15 and the intervals (or pitch) of the wheels 16 respectively are large compared to the intervals (or pitch) of the cylindrical rollers or balls 114 of the conventional X-Y stage described above in conjunction with FIG. 1. For this reason, the problem of the conventional X-Y stage associated with the pitching phenomenon can essentially be neglected in this embodiment, even if a manufacturing error or mounting error of the wheels 15 and 16 occur. In addition, because the number of the wheels 15 and 16 is considerably small compared to the number of the cylindrical roller or balls 114 used in the conventional X-Y stage described above, the X-Y stage in this embodiment has a relatively small number of parts and the construction of the X-Y stage is relatively simple.

Of course, the shape of the wheels 15 and 16 and the shape of the grooves 5a and 6a of the corresponding guide rails 5 and 6 are not limited to those of this embodiment. It is desirable, however, that the wheels 15 and 16 and the grooves 5a and 6a are shaped so that the friction between the wheel and the guide groove of the guide rail is minimized in order to smoothen the rotation of the wheels 15 and 16, and so that the movement of the wheels 15 and 16 in directions other than the rotating directions is positively prevented.

Figure 4A:
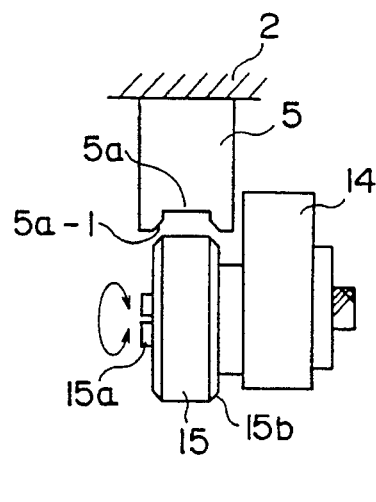
FIGS. 4A and 4B respectively are diagrams for explaining the relationships between wheels and a guide rail.

Accordingly, in this embodiment, the wheel 15 has a tapered portion 15b, and the groove 5a of the corresponding guide rail 5 has a tapered portion 5a-1 as shown in FIG. 4A. As a result, the movement of the wheel 15 in the direction X is positively locked as shown in the plan view of FIG. 4B. In addition, because the friction between the wheel 15 and the groove 5a is reduced by the action of the tapered portions 15b and 5a-1, the wheel 15 rotates smoothly to enable smooth movement of the slider 3 in the direction Y.

Figure 4B:
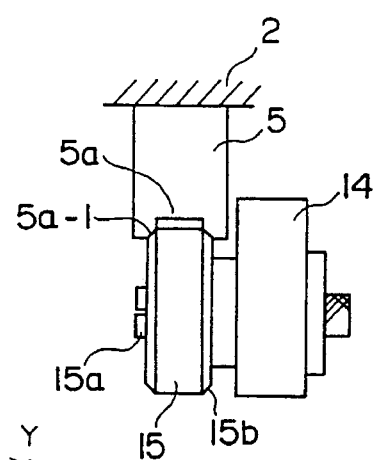

The relationship between the wheel 16 and the groove 6a of the corresponding guide rail 6 may be set similarly to the relationship between the wheel 15 and the groove 5a of the corresponding guide rail 5 as shown in FIGS. 4A and 4B.

One plane is determined originally by three points. For this reason, the upper plate 2 may be supported on the lower plate 1 via three points (that is, three wheels) of the sliders 3-1 through 3-4. In this case, as the center of gravity of the X-Y stage moves as the upper plate 2 moves, a play is introduced with respect to the upper plate 2.

Figure 5:
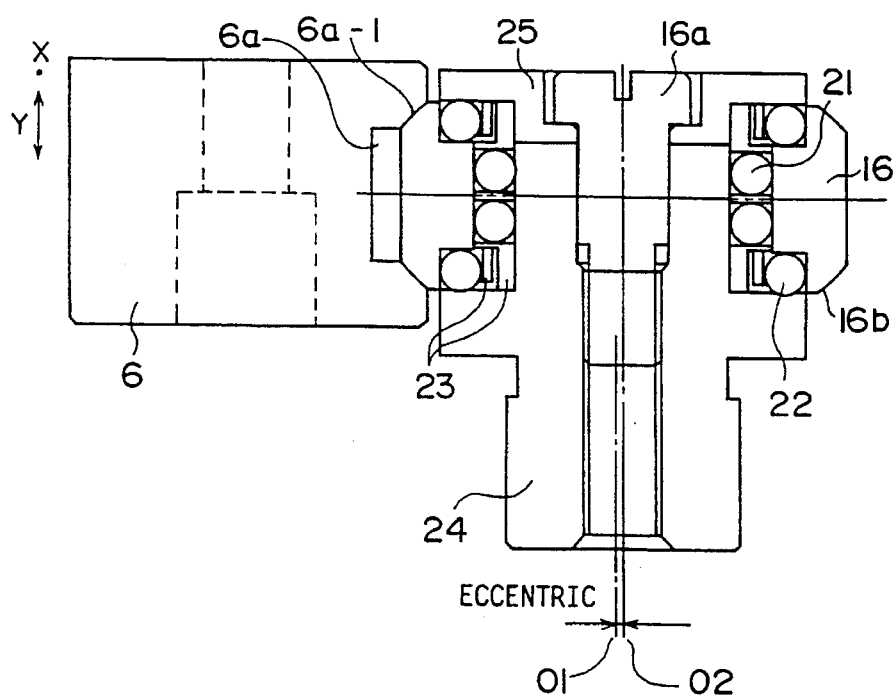
FIG. 5 is a cross sectional view showing the construction of a height adjustable wheel.

The play of the upper plate 2 caused by the movement of the center of gravity of the X-Y stage can be prevented by using a height adjustable wheel shown in FIG. 5. For the sake of convenience, FIG. 5 shows a cross section of the wheel 16 and the groove 6a of the corresponding guide rail 6 viewed from the side. But the wheel 15 and the groove 5a of the corresponding guide rail 5 may have a construction similar to that of the wheel 16 and the groove 6a.

In FIG. 5, the wheel 16 is rotatably supported on shafts 24 and 25 via a bearing and a retainer 23, where the bearing is made up of radial balls 21 and thrust balls 22. The shafts 24 and 25 are fixed by the screw 16a. In addition, a center of rotation O1 of the wheel 16 and a center O2 of the shafts 24 and 25 are eccentric. By the arrangement of the balls 21 and 22 as shown in FIG. 5, it is possible to form a bearing which independently receives the radial load and the thrust load. A sufficient pre-load may be applied on the thrust balls 22 by tightening the screw 16a. Furthermore, a sufficient pre-load may be applied on the radial balls 21 by appropriately setting the dimensions of the shaft 24 and the outer diameter of the wheel 16. For example, the shaft 24 is mounted on the support member 14 shown in FIGS. 3A and 3B.

Accordingly, the wheel 16 positively engages the corresponding guide rail 6. More particularly, the tapered portion 16a of the wheel 16 makes contact with the tapered portion 6a-1 of the corresponding guide rail 6. For this reason, the wheel 16 is locked with respect to the direction Y by the guide rail 6, and is smoothly rotatable along the grove 6a with respect to the direction X.

By using the wheels 15 and 16 having the construction shown in FIG. 5, the upper plate 2 is positively supported at four points, and it is possible to prevent play of the upper plate 2 caused by the movement of the center of gravity of the X-Y stage.

Although the illustration thereof will be omitted in FIGS. 1A and 1B, driving means such as actuators drive the rods 7 and 8 to move the upper plate 2 in the directions X and Y. The rod 7 which moves the upper plate 2 in the direction X is connected to the slider 3-4 at a position RX in FIG. 2A, for example, in addition, the rod 8 which moves the upper plate 2 in the direction Y is connected to the slider 3-2 at a position RY in FIG. 2A, for example. However, it is possible to connect the rods 7 and 8 directly to the upper plate 2 at the positions RX and RY. In any case, the connecting positions of the rods 7 and 8 are not limited to the positions RX and RY, and the connecting positions of the rods 7 and 8 may be selected arbitrarily as long as the upper plate 2 can be moved in the directions X and Y.

in this embodiment, the X-Y stage has a 2-level structure made up of the lower plate 1 and the upper plate 2. Hence, the X-Y state has a simple construction and is lighter compared to the conventional X-Y stage having the 3-level structure. Hence, in this embodiment, it is possible to easily move the upper plate 2 at a high speed. In addition, since a single upper plate 2 moves in both the directions X and Y, the X-Y stage as a whole can be made compact. Furthermore, the upper plate 2 moves in the directions X and Y via the sliders 3-1 through 3-4 having the simple construction, and no guide mechanism or the like is provided under the central part of the upper plate 2. For this reason, it is possible to carry out a process from under the upper plate 2 with respect to the member which is to be processed and is placed on the upper plate 2. In addition, when the X-Y stage is interposed between upper and lower columns of a charged particle beam exposure apparatus such as an electron beam exposure apparatus, an opening 1a may be provided at a central part of the lower plate 1 as indicated by a dotted line in FIG. 2B in order to enable processing from under the lower plate 1. This opening 1a may be formed in the lower plate 1 because no guide mechanism or the like is provided at a part confronting the opening 1a. Moreover, it is also possible to provide a space between the central portion of the upper plate 2 and the lower plate 1 if necessary.

Figure 6A:
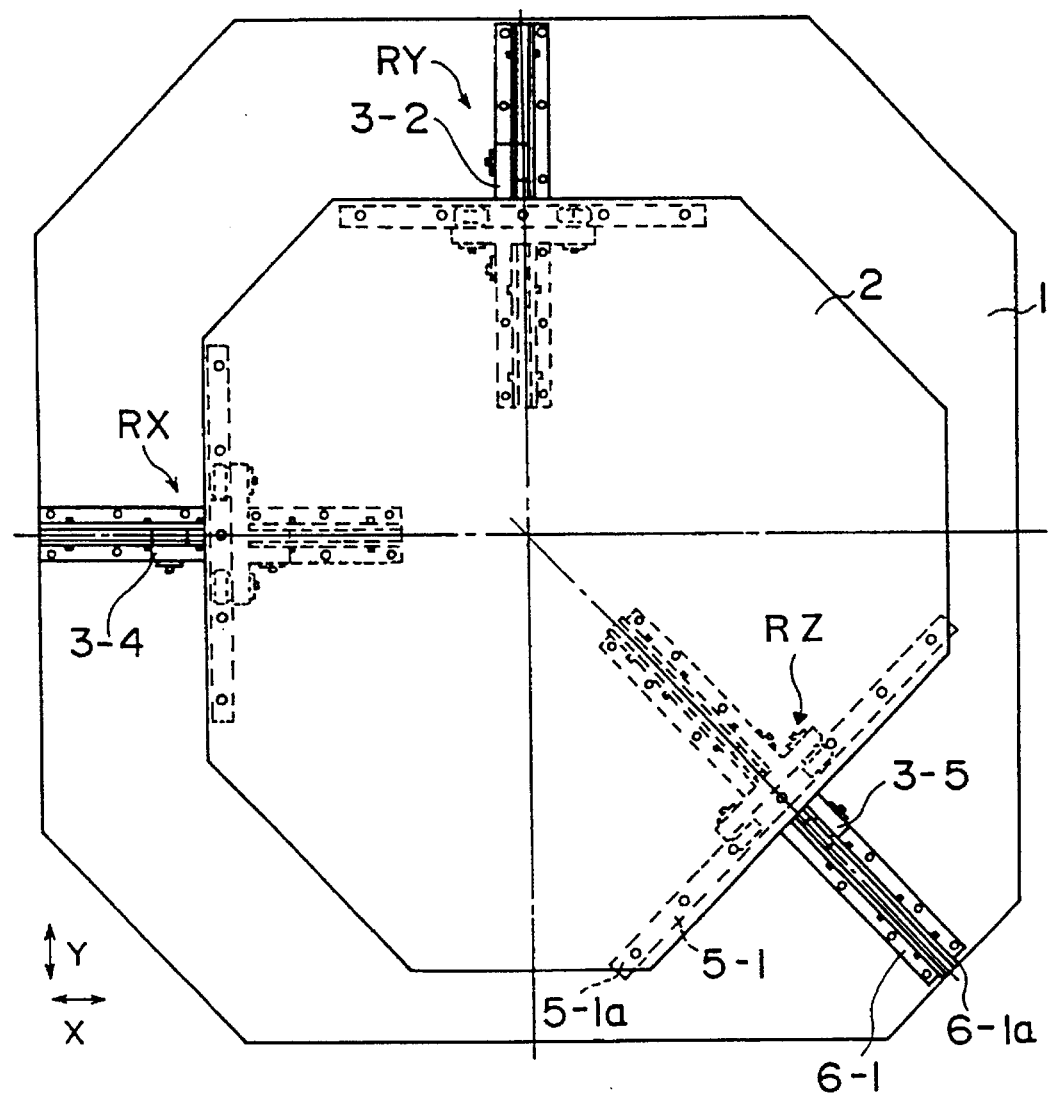
FIGS. 6A and 6B respectively are a plan view and a front view showing a second embodiment of the X-Y stage according to the present invention.
Figure 6B:
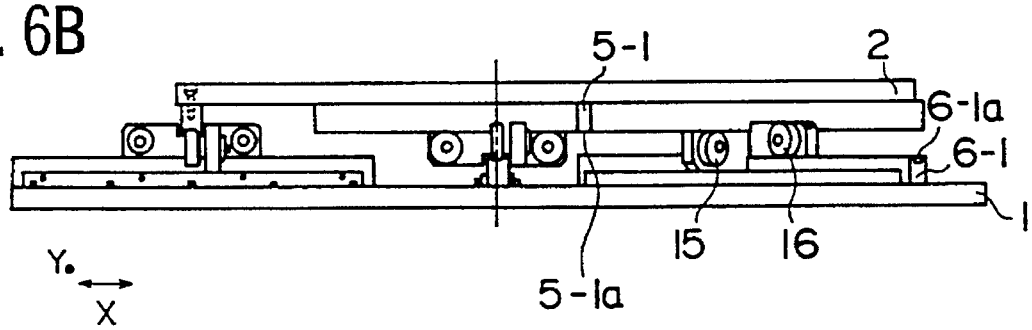

Next, a description will be given of a second embodiment of the X-Y stage according to the present invention, by referring to FIGS. 6A and 6B. FIG. 6A shows a plan view of the second embodiment, and FIG. 6B shows a front view of the second embodiment. In FIGS. 6A and 6B, those parts which are the same as those corresponding parts in FIGS. 2A and 2B are designated by the same reference numerals, and a description thereof will be omitted.

In this embodiment, only three sliders are provided. In other words, the upper plate 2 is supported on the lower plate 1 via three sliders 3-2, 3-4 and 3-5, that is, three points (wheels). As shown in FIG. 6A, one slider 3-4 is provided at the left end position, one slider 3-2 is provided at the upper end position, and the remaining one slider 3-5 is provided at a lower right position.

Each wheel 16 of the slider 3-5 is rotatable along a groove 6-1a of a corresponding guide rail 6-1 provided on the lower plate 1 shown in FIGS. 6A and 6B, thereby making the slider 3-5 movable in a direction which is inclined by 45° with respect to the direction X. On the other hand, each wheel 15 of the slider 3-5 is rotatable along a groove 5-1a of a corresponding guide rail 5-1 on the lower plate 1, thereby making the slider 3-5 movable in a direction which is inclined by 45° with respect to the direction Y. The constructions of the slider 3-5 and the guide rails 5-1 and 6-1 themselves may be the same as those of the sliders 3-1 through 3-4 and the guide rails 5 and 6 described above.

Accordingly, in this embodiment, the upper plate 2 is always supported on the lower plate 1 via three points (wheels), even if a mounting error or manufacturing errors of the parts exist. For this reason, a play of the upper plate 2 will not occur even when the center of gravity of the X-Y stage moves as the upper plate 2 moves. Therefore, the play of the upper plate 2 is positively prevented when the center of gravity of the X-Y stage moves, even without the use of the wheels shown in FIG. 5 having the height adjusting function.

Although the illustration thereof will be omitted in FIGS. 6A and 6B, driving means such as actuators drive the rods to move the upper plate 2 in the directions X and Y. The rod which moves the upper plate 2 in the direction X is connected to the slider 3-4 at a position RX in FIG. 6A, for example. In addition, the rod which moves the upper plate 2 in the direction Y is connected to the slider 3-2 at a position RY in FIG. 6A, for example. However, it is possible to connect the rods directly to the upper plate 2 at the positions RX and RY. In any case, the connecting positions of the rods are not limited to the positions RX and RY, and the connecting positions of the rods may be selected arbitrarily as long as the upper plate 2 can be moved in the directions X and Y. Furthermore, a single rod that is driven in the directions X and Y may be connected to the slider 3-5 or directly to the upper plate 2 at a position RZ shown in FIG. 6A, for example.

Figure 7A:
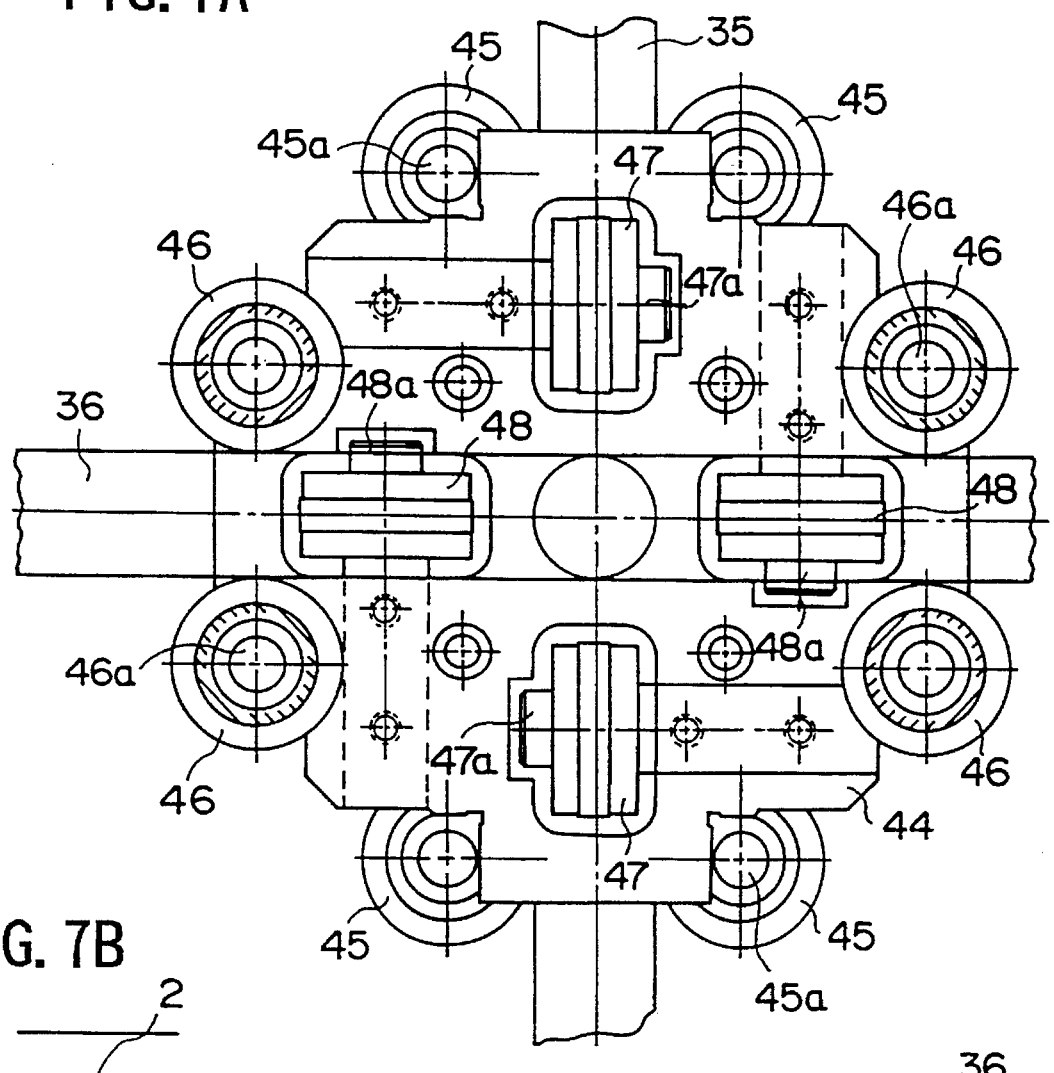
FIGS. 7A and 7B respectively are a plan view and a front view showing another embodiment of the slider.
Figure 7B:
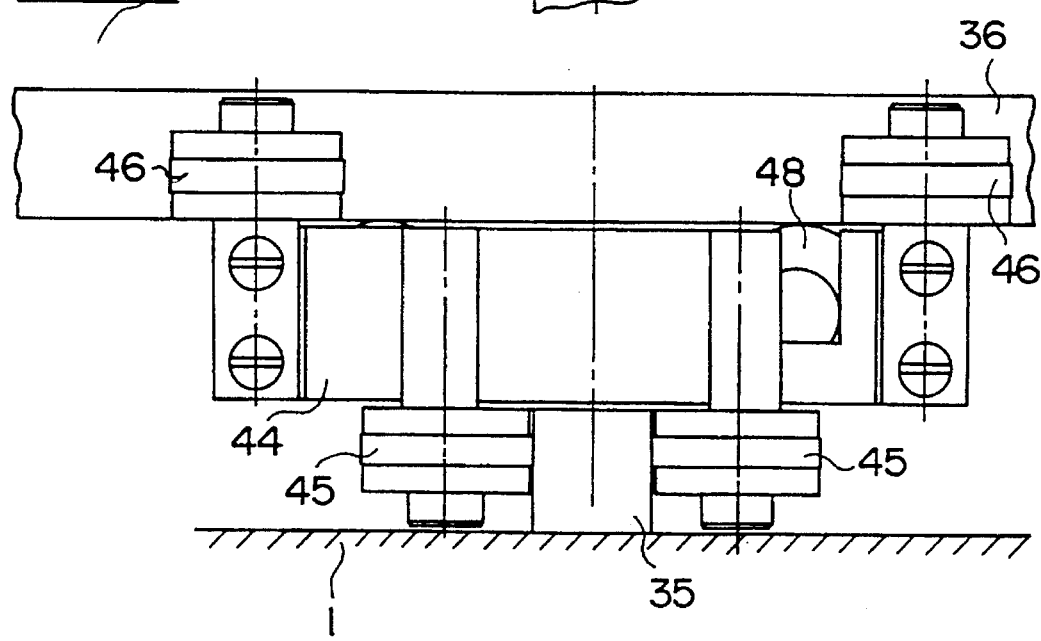

Next, a description will be given of another embodiment of the slider and guide rail, by referring to FIGS. 7A and 7B. FIG. 7A is a plan view showing the slider and guide rail, and FIG. 7B is a front view of the slider and guide rail. For the sake of convenience, it is assumed that FIGS. 7A and 7B shows a slider corresponding to the slider 3-3 shown in FIGS. 2A and 2B. In FIGS. 7A and 7B, those parts which are the same as those corresponding parts in FIGS. 2A, 2B, 3A and 3B will be described by the same reference numerals, and a description thereof will be omitted.

The slider 3-3 shown in FIGS. 7A and 7B includes a support member 44, and wheels 45, 46, 47 and 48 which are rotatably provided on the support member 44. Each wheel 45 is rotatably mounted on the support member 44 by a screw 45a via a bearing which is not visible in FIGS. 7A and 7B. Similarly, each wheel 46 is rotatable mounted on the support member 44 by a screw 46a via a bearing which is not visible in FIGS. 7A and 7B. Each wheel 47 is rotatably mounted on the support member 44 by a screw 47a via a bearing which is not visible in FIGS. 7A and 7B. Similarly, each wheel 48 is rotatably mounted on the support member 44 by a screw 48a via a bearing which is not visible in FIGS. 7A and 7B. In this embodiment, a total of twelve wheels, that is, four wheels 45, four wheels 46, two wheels 47 and two wheels 48, are provided on the support member 44. However, the numbers of each of the wheels 45 through 48 are of course not limited to those of this embodiment.

Each wheel 46 of the slider 3-3 is rotatable along a corresponding guide rail 36 of the lower plate 1 in a state where the guide rail 36 is pinched between the confronting wheels 46, thereby making the slider 3-3 movable in the direction X. In addition, when the slider 3-3 moves in the direction X, each wheel 48 rotates on and along this guide rail 36. On the other hand, each wheel 45 of the slider 3-3 is rotatable along a corresponding guide rail 35 of the lower plate 1 in a state where the guide rail 35 is pinched between the confronting wheels 35, thereby making the slider 3-3 movable in the direction Y. In addition, when the slider 3-3 moves in the direction Y, each wheel 47 rotates on and along this guide rail 35.

Because each wheel 45 of the slider 3-3 rotates under guidance of the corresponding guide rail 35, the slider 3-3, that is, the upper plate 2, will not vibrate or deviate in the direction X. On the other hand, since each wheel 46 of the slider 3-3 rotates under guidance of the corresponding guide rail 36, the slider 3-3, that is, the upper plate 2, will not vibrate or deviate in the direction Y. In other words, when the upper plate 2 moves in the direction X, each wheel 45 of the slider 3-3 engages the corresponding guide rail 35 and is locked with respect to the direction X, and as a result, the slider 3-3 and the upper plate 2 move in one piece in a state where each wheel 46 of the slider 3-3 is guided along the corresponding guide rail 36. In addition, when the upper plate 2 moves in the direction Y, each wheel 46 of the slider 3-3 engages the corresponding guide rail 36 and is locked with respect to the direction Y, and as a result, the slider 3-3 and the upper plate 2 move in one piece in a state where each wheel 45 of the slider 3-3 is guided along the corresponding guide rail 35.

The wheels 47 and 48 have the function of substantially supporting the weight of the upper plate 2 with respect to the lower plate 1. In other words, according to the slider having the construction shown in FIGS. 3A and 3B, each of the wheels 15 and 16 have both the function of guiding the slider along the corresponding guide rails 5 and 6 and the function of supporting the weight of the upper plate 2. But according to the slider having the construction shown in FIGS. 7A and 7B, the function of guiding the slider along the corresponding guide rails 35 and 36 and the function of supporting the weight of the upper plate 2 are realized by independent wheels. More particularly, each of the wheels 45 and 46 have the function of guiding the slider along the corresponding guide rails 35 and 36, and each of the wheels 37 and 38 have the function of supporting the weight of the upper plate 2.

The slider 3-3 shown in FIGS. 7A and 7B may be used for each of the sliders 3-1 through 3-5 of the first and second embodiments described above. In either case, the operation is basically the same as that described above, and a description thereof will be omitted.

According to the slider shown in FIGS. 3A and 3B, the frictional wear of the wheels and the groove of the corresponding guide rail to a certain extent caused by the contact between the wheels and the groove is unavoidable. However, according to the slider shown in FIGS. 7A and 7B, the guide rail is pinched between the confronting wheels, and the frictional wear of the wheels and the corresponding guide rail caused by the contact between the wheels and the corresponding guide rail is extremely small. For this reason, the moving precision of the X-Y stage can be maintained for an extremely long period of time according to the slider shown in FIGS. 7A and 7B.

Of course, it is possible to provide both the slider shown in FIGS. 7A and 7B and the slider shown in FIGS. 3A and 3B. In addition, the wheels which are guided by the groove of one guide rail and the wheels which pinch the other guide rail may coexist in one slider.

In each of the embodiments described above, the materials used for the wheels are not limited to a particular material. However, it is desirable that materials having a high hardness are used for the wheels. For example, such materials having the high hardness may be selected from a group consisting of hard metals and ceramics such as silicon nitride. In addition, when using the X-Y stage under high vacuum or in an electron beam exposure apparatus or the like which needs to avoid the effects of magnetic fields, it is desirable to use non-magnetic materials for the wheels. Furthermore, the materials used for the guide rails are also not limited to a particular material, but it is desirable that materials having a high hardness such as hard metals and ceramics such as silicon nitride are used for the guide rails.

The shapes of the lower plate (or base) 1 and the upper plate (or stage) 2 are of course not limited to those of the embodiments described above.

Figure 8:
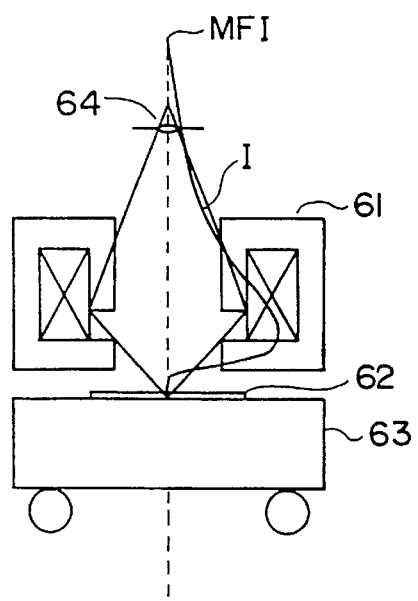
FIG. 8 is a diagram showing an example of a conventional electromagnetic lens.

An electromagnetic lens of the electron beam exposure apparatus has a construction shown in FIG. 8, for example. An electromagnetic lens 61 is arranged above an X-Y stage 63, and a wafer 62 is placed on this X-Y stage 63. The electromagnetic lens 61 converges and images an electron beam that is obtained via a diaphragm 64 on the wafer 62. In FIG. 8, MFI denotes a magnetic field intensity, and I denotes a magnetic field intensity of the electromagnetic lens 61.

According to the electromagnetic lens 61 shown in FIG. 8, the electron beam is converged and imaged outside the magnetic field of the electromagnetic lens 61. On the other hand, it is conceivable to converge and image the electron beam within the magnetic field of the electromagnetic lens as in the case of an in-lens type immersion lens shown in FIG. 9.

Figure 9:
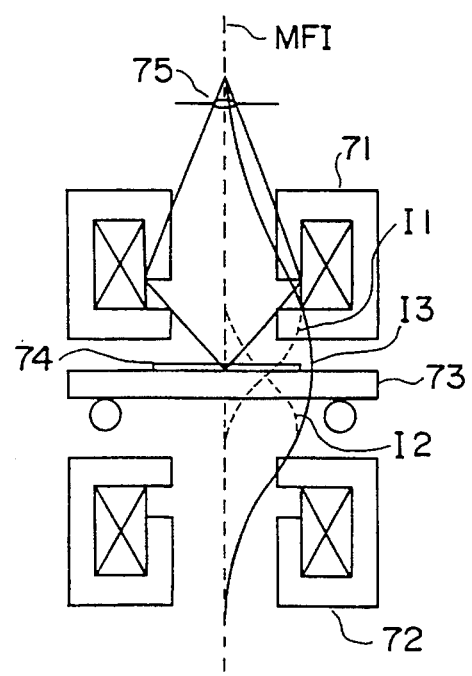
FIG. 9 is a diagram showing a part of an embodiment of a charged particle beam exposure apparatus according to the present invention.

FIG. 9 shows a part of an embodiment of a charged particle beam exposure apparatus according to the present invention. In FIG. 9, a first electromagnetic lens 71 and a second electromagnetic lens 72 are arranged to sandwich an X-Y stage 73 having a wafer 74 placed thereon. The first and second electromagnetic lenses 71 and 72 converge and image an electron beam which is obtained via a diaphragm 75 on the wafer 74. In FIG. 9, MFI denotes a magnetic field intensity, I1 denotes a magnetic field intensity of the first electromagnetic lens 71, I2 denotes a magnetic field intensity of the second electromagnetic lens 72, and I3 denotes a combined magnetic field of the first and second electromagnetic lenses 71 and 72.

According to the in-lens type immersion lens shown in FIG. 9, the aberration (image blur) which is a numerical value indicating the performance of the electromagnetic lens is small. If it is assumed that the conventional electromagnetic lens shown in FIG. 8 has an image blur of approximately 0.03 µm, for example, the in-lens type immersion lens shown in FIG. 9 can suppress the image blur to approximately 0.01 µm, thereby improving the resolution to approximately three times that obtainable in the conventional electromagnetic lens.

In addition, according to the in-lens type immersion lens shown in FIG. 9, it is possible to increase the diameter of the diaphragm with respect to the same resolution when compared to the conventional electromagnetic lens shown in FIG. 8. Generally, the image becomes brighter as the diaphragm becomes larger, and the electron beam irradiation time can be shortened by an amount corresponding to the increased brightness. However, the image blur becomes greater as the diaphragm becomes larger. On the other hand, according to the in-lens type immersion lens shown in FIG. 9, the image blur is small, and it is possible to guarantee a desired resolution even if the diaphragm is set large. For example, if approximately the same image blur is permitted in the conventional electromagnetic lens shown in FIG. 8 and in the in-lens type immersion lens shown in FIG. 9, the in-lens type immersion lens shown in FIG. 9 can increase the diameter of the diaphragm to approximately 1.3 times and the electron beam irradiation time can be reduced to approximately 60%, thereby making it possible to improve the throughput.

According to the conventional electromagnetic lens shown in FIG. 8, it is impossible to converge and image the electron beam within the magnetic field of the electromagnetic lens. In addition, even in the case of the in-lens type immersion lens shown in FIG. 9, the weight of the X-Y stage 73 itself would be too large if the 3-level structure shown in FIG. 1 were employed, and it would be impossible to converge and image the electron beam within the magnetic field of the electromagnetic lens because the guide mechanism and the like are provided under the central portion of the X-Y stage. On the other hand, by using the compact X-Y stage of the present invention having the construction of the described embodiments as the X-Y stage 73 shown in FIG. 9, it is possible to satisfactorily converge and image the electron beam within the magnetic field of the electromagnetic lens.

The application of the present invention is of course not limited to the charged particle beam exposure apparatuses such as the electron beam exposure apparatus, and the present invention is similarly applicable to various kinds of machine tools which require the X-Y stage.

Further, the present invention is not limited to these embodiments, but various variations and modifications may be made without departing from the scope of the present invention.

What is claimed is:

1. An X-Y stage comprising:
   a base having a first guide rail extending in a first direction;
   a stage having a second guide rail extending in a second direction perpendicular to the first direction, said stage being movable with respect to said base in mutually perpendicular directions X and Y; and
   a slider arranged between said base and said stage and having a plurality of first wheels provided with respect to said first guide rail and rotatable under guidance of said first guide rail and a plurality of second wheels provided with respect to said second guide rail and rotatable under guidance of said second guide rail,
   said first wheels blocking a movement of said slider in the second direction by engaging said first guide rail when said stage moves in the second direction,
   said second wheels blocking a movement of said slider in the first direction by engaging said second guide rail when said stage moves in the first direction, and
   said slider being arranged in at least three locations.

2. The X-Y stage as claimed in claim 1, wherein said slider is arranged in a total of four locations including two confronting locations along the direction X and two confronting locations along the direction Y.

3. The X-Y stage as claimed in claim 1, wherein said slider is arranged in a total of three locations including one location corresponding to one end of said stage in the direction X, one location corresponding to one end of said stage in the direction Y, and one location on a diagonal of a corner portion defined by two ends of said stage.

4. The X-Y stage as claimed in claim 1, wherein said first guide rail has a first groove, and said first wheels are guided within said first groove and rotate along the first direction.

5. The X-Y stage as claimed in claim 4, wherein said second guide rail has a second groove, and said second wheels are guided within said second groove and rotate along the second direction.

6. The X-Y stage as claimed in claim 1, wherein at least one of said first and second wheels are mounted on said slider via a bearing which independently receives radial load and thrust load.

7. The X-Y stage as claimed in claim 6, wherein at least one of said first and second wheels are mounted on said slider via a mechanism which adjusts positions of said first and second wheels with respect to said first and second guide rails in directions in which said first wheels make contact with said first guide rail and said second wheels make contact with said second guide rail.

8. The X-Y stage as claimed in claim 1, wherein said first wheels rotate along said first direction by pinching said first guide rail between confronting ones of said first wheels.

9. The X-Y stage as claimed in claim 8, wherein said second wheels rotate along said second direction by pinching said second guide rail between confronting ones of said second wheels.

10. The X-Y stage as claimed in claim 1, wherein said base has an opening at a central portion thereof.

11. A charged particle beam exposure apparatus adapted to irradiate a charged particle beam on a substrate via a diaphragm, said charged particle beam exposure apparatus comprising:
    an X-Y stage having the substrate placed thereon; and
    an immersion lens converging and imaging the charged particle beam obtained via the diaphragm within a magnetic field of said immersion lens onto the substrate,
    said X-Y stage comprising:
      a base having a first guide rail extending in a first direction;
      a stage having a second guide rail extending in a second direction perpendicular to the first direction, said stage being movable with respect to said base in mutually perpendicular directions X and Y; and
      a slider arranged between said base and said stage and having a plurality of first wheels provided with respect to said first guide rail and rotatable under guidance of said first guide rail and a plurality of second wheels provided with respect to said second guide rail and rotatable under guidance of said second guide rail,
      said first wheels blocking a movement of said slider in the second direction by engaging said first guide rail when said stage moves in the second direction,
      said second wheels blocking a movement of said slider in the first direction by engaging said second guide rail when said stage moves in the first direction, and
      said slider being arranged in at least three locations.

12. The charged particle beam exposure apparatus as claimed in claim 11, wherein said immersion lens comprises a pair of electromagnetic lenses arranged such that said X-Y stage is interposed between said pair of electromagnetic lenses.

13. The charged particle beam exposure apparatus as claimed in claim 12, wherein said slider is arranged in a total of four locations including two confronting locations along the direction X and two confronting locations along the direction Y.

14. The charged particle beam exposure apparatus as claimed in claim 12, wherein said slider is arranged in a total of three locations including one location corresponding to one end of said stage in the direction X, one location corresponding to one end of said stage in the direction Y, and one location on a diagonal of a corner portion defined by two ends of said stage.

15. The charged particle beam exposure apparatus as claimed in claim 12, wherein said first guide rail has a first groove, and said first wheels are guided within said first groove and rotate along the first direction.

16. The charged particle beam exposure apparatus as claimed in claim 15, wherein said second guide rail has a second groove, and said second wheels are guided within said second groove and rotate along the second direction.

17. The charged particle beam exposure apparatus as claimed in claim 12, wherein at least one of said first and second wheels are mounted on said slider via a bearing which independently receives radial load and thrust load.

18. The charged particle beam exposure apparatus as claimed in claim 17, wherein at least one of said first and second wheels are mounted on said slider via a mechanism which adjusts positions of said first and second wheels with respect to said first and second guide rails in directions in which said first wheels make contact with said first guide rail and said second wheels make contact with said second guide rail.

19. The charged particle beam exposure apparatus as claimed in claim 12, wherein said first wheels rotate along said first direction by pinching said first guide rail between confronting ones of said first wheels.

20. The charged particle beam exposure apparatus as claimed in claim 19, wherein said second wheels rotate along said second direction by pinching said second guide rail between confronting ones of said second wheels.

21. The charged particle beam exposure apparatus as claimed in claim 12, wherein said base has an opening at a central portion thereof.

* * * * *